United States Patent

[11] 3,597,666

[72] Inventor Hugo G. Taskovich
Palo Alto, Calif.
[21] Appl. No. 879,998
[22] Filed Nov. 26, 1969
[45] Patented Aug. 3, 1971
[73] Assignee Fairchild Camera and Instrument Corporation
Mountain View, Calif.

[54] LEAD FRAME DESIGN
11 Claims, 10 Drawing Figs.

[52] U.S. Cl. .......... 317/234 R, 317/235 R, 317/234 A, 317/234 N, 317/234.6, 29/193.5, 29/589
[51] Int. Cl. .......... H01l 5/00
[50] Field of Search .......... 317/234; 29/193.5, 589

[56] References Cited

UNITED STATES PATENTS

| | | | |
|---|---|---|---|
| 3,500,136 | 3/1970 | Fischer .......... | 317/234 |
| 3,522,490 | 8/1970 | Kauffman .......... | 317/234 |

*Primary Examiner*—John W. Huckert
*Assistant Examiner*—B. Estrin
*Attorneys*—Roger S. Borovoy and Alan H. MacPherson

ABSTRACT: A lead frame strip contains a plurality of groups of leads, each group spring locking a semiconductor die between an extension of the collector lead and extensions of the base and emitter leads prior to soldering the die to the leads.

INVENTOR.
HUGO G. TASKOVICH
BY Alan H. MacPherson
ATTORNEY

INVENTOR.
HUGO G. TASKOVICH
BY Van H. MacPherson
ATTORNEY

LEAD FRAME DESIGN

BACKGROUND OF THE INVENTION

1. Field of the Invention

The invention relates to lead frames, and in particular to a lead frame strip containing a plurality of groups of leads wherein each group of leads connected to the lead frame is bent in such a manner as to spring lock the semiconductor die into position between the collector lead and the base and emitter leads prior to soldering the leads to the die.

2. Prior Art

Typically, semiconductor dies are attached to substrates by placing a layer of solder on the substrate, heating the substrate to melt the solder, and then placing the die on the solder and "scrubbing" the die into the substrate to ensure good bond between the die, the solder and the substrate. When the die contains a discrete transistor, the connection between the die and the substrate serves as the collector lead to the transistor. Wires are then attached from contact pads on the surface of the die to extensions of the pins from the die package to form the base and emitter leads to the transistor. Such die and wire bonding operations are tedious and expensive.

SUMMARY OF THE INVENTION

This invention substantially simplifies attaching a semiconductor die containing a discrete device, such as a transistor, to leads extending from the die package, by eliminating the wires and thus the wire bonding operation formerly used in packaging such discrete devices.

According to this invention, the collector, base and emitter leads for one die are formed in a group, together with similar lead groups for other dies, on a lead frame. The collector lead extends from a portion of the lead frame which will serve as the heat sink for the semiconductor die and to which the bottom of the semiconductor die will be attached. A portion of this collector lead immediately adjacent to the heat sink is then bent into an S-shape. This places the emitter, base and collector leads in a plane parallel to and above the plane occupied by the heat sink portions of the lead frame. Prior to the bending of the collector lead, the top portions of the emitter and base leads are bent to form a U-shaped structure.

These top portions comprise strips of metal originally perpendicular to, in the plane of, and pointing outward from, the main axes of the emitter, base and collector leads. The "U-bend" in these top portions turn then down toward the plane of the heat sink and back in toward the central collector lead. The "S-bend" in the collector lead places these U-shaped structures above the heat sink portion of the lead frame. By applying a downward force on the bottom portions of the leads, the U-shaped terminations of the base and emitter leads are lifted from the heat sink and a semiconductor die can then be inserted under these leads onto the heat sink. Allowing the lead frame to spring back to its normal position forces the U-shaped ends of the base and emitter leads down onto those portions of the semiconductor die to which they are to be attached. The spring force in the S-bend of the collector lead holds the ends of the base and emitter leads firmly onto the semiconductor die thereby pressing the die between the base and emitter leads and the heat sink. Both the heat sink and the ends of the base and emitter leads have previously been coated with solder. The resulting lead frame die combination is passed through a furnace where the solder is melted, thereby attaching the die to the base, emitter and collector leads.

The lead frame of this invention is formed from one strip of metal. The S-bend in the collector lead of each group of leads provides sufficient spring force to grip the die firmly between the base and emitter leads and the heat sink collector portion of the lead frame. This structure is particularly suited to the automatic bonding of semiconductor dies to the leads from the package.

After the bonding operation, the lead frame with dies attached is cleaned, the dies and adjacent portions of the leads are coated with a junction coating and the lead frame with the semiconductor die attached is taken to a plastic molding machine where plastic is injected around the die and the lead frame. After certain trimming operations to remove surplus metal needed mainly for support of the leads prior to the plastic encapsulating operation, the package is complete and ready for testing and classification.

DETAILED DESCRIPTION

The lead configuration of this invention, which is particularly suitable for use with power devices, is formed from a single piece of material, typically copper or a copper alloy, such as OLIN* 114, with good heat absorption properties. Of course, other conductive materials which possess good heat transfer and electrical properties can be used to form the leads of this invention.

Figure 1A:
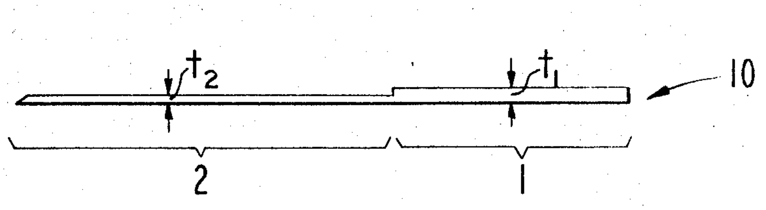
FIGS. 1*a* and 1*b* show the lead frame strip of this invention in side view and after each group of three leads has been formed from the strip, respectively.

FIG. 1*a* shows the cross section of the flat strip of metal from which the leads of this invention are formed. This strip has two thicknesses, a thickness $t_1$ in section 1 which will later form the collector contact and heat sink for the semiconductor device, and a thickness $t_2$ in section 2, from which the actual base, collector and emitter leads will be formed. This strip is long enough to allow a large number of groups of leads to be formed on a single strip and is typically about 1½ inches wide. Thickness $t_1$ is typically about 50 mils while thickness $t_2$ is about 10 mils.

Figure 1B:
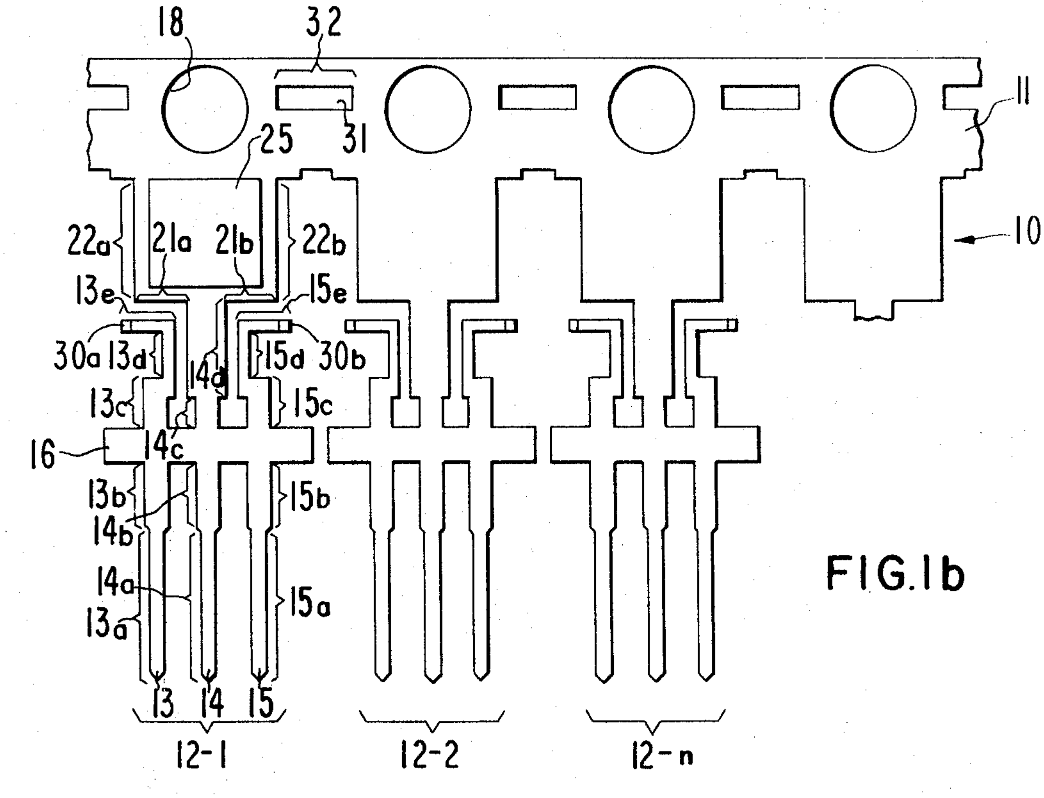

Groups of leads of a shape shown from a top view in FIG. 1*b* are formed from the strip 10 shown in FIG. 1*a* by stamping the strip. The general shape of the leads will be described in conjunction with lead group 12–1 (FIG. 1*b*). When the leads are to be used with a discrete transistor, each group contains three leads. Of course, other numbers of leads could also be used in conjunction with this invention with appropriate redesign of the lead structure. However, the primary purpose for which the leads of this invention were designed is the attachment of a transistor die to a substrate.

Group 12–1 contains an emitter lead 13, a collector lead 14 and a base lead 15. The base and emitter leads can, if desired, be interchanged. Leads 13 and 15 are substantially identical and will be described first. Thin portions 13*a* and 15*a*, each typically about five-sixteenth inch long, extend downward from shoulders 13*b* and 15*b*, respectively. Shoulders 13*b* and 15*b* are about one-eighth inch long. Shoulders 13*b* and 15*b* prevent leads 13*a* and 15*a* from being inserted beyond a given depth into sockets. Metal shorting bar 16 serves to hold leads 13, 14 and 15 in the proper relative location during the processing of the lead strip and the attachment of a die to the strip. Portions of metal 16 are removed after the semiconductor device has been attached to the leads and encapsulated in plastic.

Portions 13*c* of lead 13 and 15*c* of lead 15 extend beyond supporting bar 16. From these two portions extend narrower portions 13*d* and 15*d*, which terminate in thin tongues of metal 13*e* and 15*e* respectively, which each form a 90° angle with their supporting metal 13*d* and 15*d*. Each tongue 13*e* and 15*e* points outward from the group of leads 12–1 in a direction perpendicular to the center axis of the lead group but in the plane of the lead group. Tongues 13*e* and 15*e* terminate in thin portions of metal 30*a* and 30*b* respectively. Portions 30*a* and 30*b* are coated with a solder.

Figure 2A:
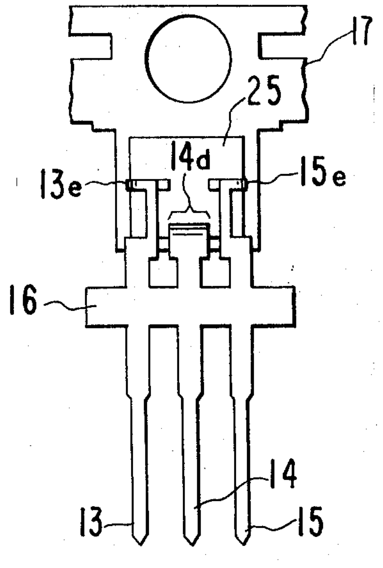
FIGS. 2*a*—2*c* show, in more detail, one group of three leads formed from the lead frame strip of FIG. 1.
Figure 2B:
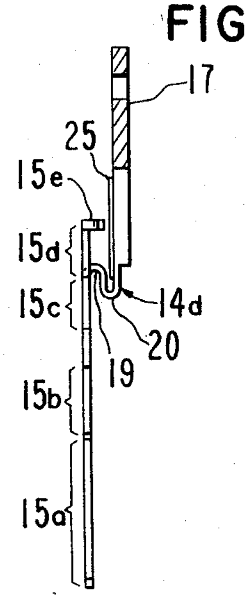
Figure 2C:
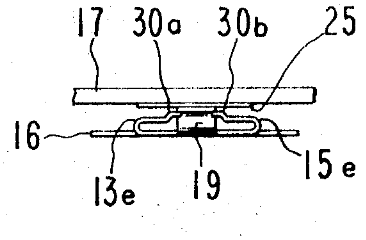

Collector lead 14 likewise has a long thin portion 14*a* with the same length as portions 13*a* and 15*a* of leads 13 and 15 respectively, and shoulder 14*b*. Section 14*c* of lead 14, however, soon flares into a thicker portion 14*d*. Portion 14*d* is about one-tenth of an inch wide and, as shown in FIGS. 2*a* and 2*b*, is bent to form an S-curve. Bending section 14*d* lifts all the leads in group 12–1 above the original plane of lead strip 10 into a higher plane by the thickness of the "S-bend." Prior to the bending of lead 14*d* to form the S-bend, tongues 13*e* and 15*e* on leads 13 and 15 are respectively bent under and back upon themselves to form small U's as shown in the top view of FIG. 2*c*. As shown in FIG. 2*c*, portions 30*a* and 30*b* are slightly offset. Thus, the combined bending of section 14*d* and tongues 13*e* and 15*e* result in portions 30*a* and 30*b* being located just above heat sink portion 17 of the leads. Tongues 13*e* and 15*e* form contacts and spring arms which will later press against a semiconductor die to hold the semiconductor die between collector contact and heat sink 17 and the emitter and base leads.

Prior to the bending of lead 14*d*, a portion of heat sink 17 has been coated with a thin layer of solder 25 for use in attaching a semiconductor die to heat sink 17. In addition, tips 30*a* and 30*b* have also been coated with solder so that these tips can be attached to base and emitter pads on the semiconductor die. Placed near the top of heat sink 17 is heat sink mounting hole 18, used to attach each encapsulated transistor to a circuit board heat sink.

Next, leads 13, 14 and 15 are slightly bent to form a small angle with the plane of the lead strip. This bending lifts contact pads 30*a* and 30*b* on the tips 13*e* and 15*e* of leads 13 and 15 respectively, away from solder 25 on heat sink 17. A semiconductor die 26 is then inserted either by hand or automatically by machine beneath ends 30*a* and 30*b* of leads 13*e* and 15*e*. Removal of the pressure on portions 13*a*, 14*a* and 15*a* of leads group 12–1 allows the spring force contained in S-bend 14*d* to force this lead group to spring back to its normal position. Because the S-bend support arm is at least 10 mils thick, the spring force contained within this arm is sufficient to press firmly ends 30*a* and 30*b* of leads 13 and 15 against die 26, thereby holding die 26 between these leads and heat sink 17.

The lead strip is next fed automatically into a furnace, where the solder 25 on heat sink 17 and the solder coating ends 30*a* and 30*b* of leads 13 and 15 respectively is heated to sufficient temperature to melt and bond to the contact portions of the semiconductor die.

The material selected for the leads must be capable of maintaining its elasticity at soldering temperatures (about 450° C. when a lead, silver, indium solder is used.) OLIN 114 or 108 maintains sufficient elasticity at this temperature for use with this invention. Although the lead, silver, indium solder melts at around 305° C., to ensure good bonds, the furnace in which the soldering is done is kept at around 450° C.

Upon emerging from the furnace, the lead strip with the dies attached to the leads, is cooled and then a junction coating is applied to the die and leads. Before coating the junctions, the leadframe with the dies attached is cleaned, either by deionized water, or xylene the junction coating might be a silicone material such as SES (semiconductor elastic sealer). Alternatively, Dow Corning XR60-087 can be used. Then the strip with the junction coating is heated to between 150° C. to 200° C. to remove impurities from this coating.

Figure 3A:
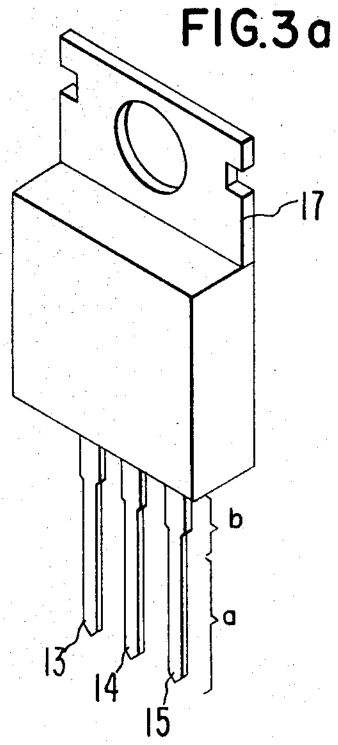
FIGS. 3*a* and 3*b* show isometric and side views, respectively, of the package formed using the group of leads shown in FIGS. 2*a* through 2*c*.
Figure 3B:
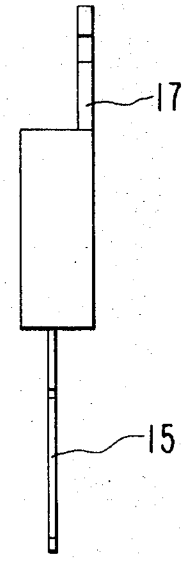
Figure 4A:
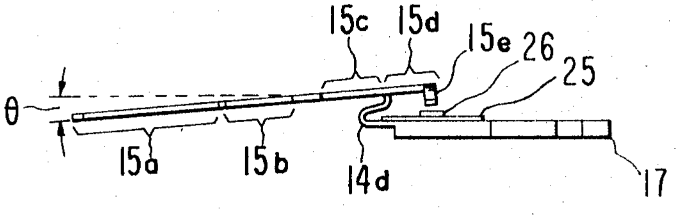
FIGS. 4*a* and 4*b* show a side view of the group of leads shown in FIGS. 2*a* through 2*c* during the placement of a semiconductor die 26 between the emitter and base lead portions 13*e* and 15*e* and heat sink 17.
Figure 4B:
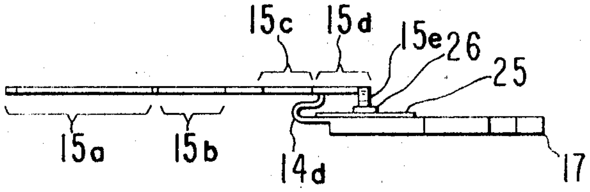
Figure 5:
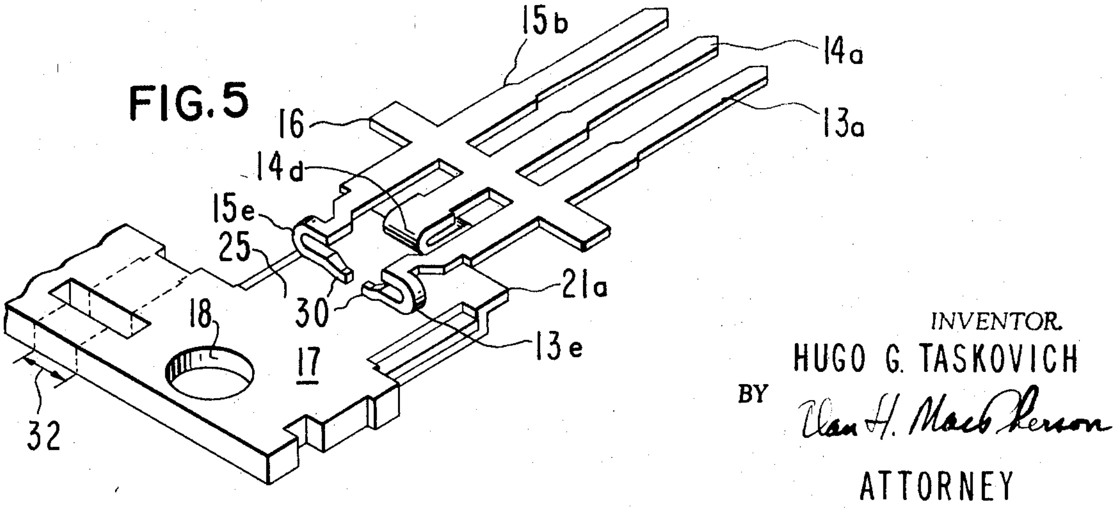
FIG. 5 shows an isometric view of a group of three leads from the lead frame strip shown in FIG. 1*b*.

The strip with the coated dies attached is next transmitted to a plastic transfer molding machine. There, plastic is placed around that portion of heat sink 17 beneath heat sink mounting hole 18 including the S-bend 14*d*, semiconductor die 26 and those portions of leads 13, 14 and 15 above shorting bar 16. This plastic package then appears as shown in FIG. 3*a*. Bottom portions *a*, *b* and part of *c* of leads 13, 14 and 15 extend beneath the bottom of the package. Shorting bar 16 has been selectively removed between leads 13, 14 and 15 so that each lead now is electrically isolated from the other leads. Heat sink 17 is also separated from the adjacent heat sinks by stamping the top of the lead frame or otherwise cutting this lead frame in region 32 containing hole 31. Hole 31 simplifies the cutting operation and allows the automatic indexing of the strip to ensure that cutting occurs in the proper position. The indentations in heat sink 17 left over from cavity 31 after each package has been separated from adjacent packages also make easier the automatic handling of the package.

Because heat sink 17 has a thickness about 5 times that of the remainder of the leads, heat produced by the die is carried through heat sink 17 out of the package and allowed to radiate and transfer to the environment from the top portion of heat sink 17. The lead strip eliminates completely the wire bonding operation commonly used to attach the emitter and base regions of a semiconductor die to the leads from the package. Consequently, the lead strip considerably lowers the cost of producing plastic transistors.

It should be noted that the portion of heat sink 17 encapsulated by plastic is tapered to assist in locking the heat sink in the plastic. In addition, portions of the sides of the heat sink are ribbed to further lock the heat sink in the plastic.

What I claim is:

1. A semiconductor lead strip comprising a plurality of interconnected groups of leads, each group of leads including
   - a heat sink portion located in a first plane,
   - a selected lead attached to and extending from said heat sink, the portion of said selected lead adjacent said heat sink forming an S-shaped bend such that the remainder of said first lead occupies a second plane parallel to but removed from said first plane, and
   - a multiplicity of leads attached to said selected lead by temporary supporting material, each of said multiplicity of leads being in said second plane and each containing a first end above said heat sink, a tongue of metal extending from each first end in said second plane away from said selected lead, each tongue of metal bending down toward said first plane and back towards said selected lead to form a U-shaped bend, and each tongue containing on its end a coating of solder.

2. Structure as in claim 1 in which said heat sink portion of each group of leads contains on that portion of its face immediately beneath the ends of said tongues of metal, a layer of solder.

3. Structure as in claim 2, wherein each group of leads contains three leads, said selected lead comprising the collector lead, and said multiplicity of leads comprising base and emitter leads said base and emitter leads being located on opposite sides of said collector lead and being attached to said collector lead by a shorting bar, said heat sink serving also as the collector contact.

4. Structure as in claim 3 wherein each group of leads contains a semiconductor die placed on said layer of solder on said heat sink, such that said die is held between said heat sink and the tongues of metal extending from said base and emitter leads, said tongues of metal being pressed against contact regions on said semiconductor die by the spring force in said S-shaped bend in said collector lead.

5. Structure as in claim 4 wherein in each group of leads said semiconductor die is attached by solder to said heat sink and to said tongues extending from said base and emitter leads.

6. Structure as in claim 5 wherein each group of leads said semiconductor die and selected portions of said tongues of metal and said heat sink have been coated with a junction coating to protect said semiconductor die.

7. Structure as in claim 6 wherein each of said groups of leads, together with the corresponding semiconductor die and junction coating has been encapsulated in plastic, thereby to provide a plastic package for the semiconductor die and its three leads.

8. Structure as in claim 7 wherein each semiconductor die contains a transistor.

9. Structure as in claim 7 wherein each semiconductor die contains a diode.

10. Structure as in claim 7 wherein said heat sink extends from the top of said plastic package, and said collector, base and emitter leads extend from the bottom of said plastic package, said heat sink contains a hole therein for use in mounting said package, and the shorting bar connecting said collector, base and emitter leads has been removed thereby to electrically isolate each lead from said package except as said leads are interconnected through said semiconductor die.

11. A group of leads comprising a heat sink portion located in a first plane, a selected lead attached to and extending from said heat sink, the portion of said selected lead adjacent said heat sink forming an S-shaped bend such that the remainder of said first lead occupies a second plane parallel to but removed from said first plane, and a multiplicity of leads attached to said selected lead by temporary supporting material, each of said multiplicity of leads being in said second plane and each containing a first end above said heat sink, a tongue of metal extending from each first end in said second plane away from said selected lead, each tongue of metal bending down toward said first plane and back towards said selected lead to form a U-shaped bend, and each tongue containing on its end a coating of solder.